United States Patent [19]

Kim

[11] Patent Number: 5,981,327
[45] Date of Patent: Nov. 9, 1999

[54] METHOD FOR FORMING WELLS OF SEMICONDUCTOR DEVICE

[75] Inventor: Jin-Ho Kim, Chungcheongbuk-do, Rep. of Korea

[73] Assignee: LG Semicon Co., Ltd., Chungcheongbuk-do, Rep. of Korea

[21] Appl. No.: 09/042,726

[22] Filed: Mar. 17, 1998

[30] Foreign Application Priority Data

Apr. 10, 1997 [KR] Rep. of Korea ...................... 97-13204

[51] Int. Cl.⁶ .............................................. H01L 21/8238
[52] U.S. Cl. .......................... 438/228; 438/451; 438/526; 438/527
[58] Field of Search .................................... 438/228, 227, 438/224, 223, 527, 526, 451, 420, 275, 216, 217, 218

[56] References Cited

U.S. PATENT DOCUMENTS

| | | | |
|---|---|---|---|
| 5,286,666 | 2/1994 | Katto et al. | 438/298 |
| 5,293,060 | 3/1994 | Komori et al. | 257/544 |
| 5,536,665 | 7/1996 | Komori et al. | 438/527 |
| 5,693,505 | 12/1997 | Kobayashi | 438/217 |
| 5,880,014 | 3/1999 | Park et al. | 438/527 |

*Primary Examiner*—Michael Trinh
*Attorney, Agent, or Firm*—Morgan, Lewis & Bockius LLP

[57] ABSTRACT

A method for forming wells of a semiconductor device, comprising the steps of forming a plurality of field insulating layers on a field region of a semiconductor substrate; forming first impurity regions of a first conductive type at a first depth beneath a surface of the semiconductor substrate; forming first impurity regions of a second conductive type beneath the surface of the semiconductor substrate at a second depth between the field insulating layers; selectively forming second impurity regions of the second conductive type in the first impurity regions of the first conductive type between adjacent field insulating layers; forming second impurity regions of the first conductive type in the first impurity regions of the second conductive type at both sides of the second impurity regions of the second conductive type; and diffusing the first and second impurity regions of the first conductive type and the first and second impurity regions of the second conductive type by a drive-in process to form a first conductive type shield region, a first conductive type well, and first and second wells of a second conductive type.

12 Claims, 4 Drawing Sheets

METHOD FOR FORMING WELLS OF SEMICONDUCTOR DEVICE

This application claims the benefit of Korean Application No. 13204/1997, filed Apr. 10, 1997, which is hereby incorporated by reference.

BACKGROUND OF THE INVENTION

1. Field of the Invention

The present invention relates to a semiconductor device and, more particularly, to a method for forming wells of a semiconductor device.

2. Discussion of the Related Art

In order to improve performance of a semiconductor device, impurity ions of an opposite conductive type to that of a semiconductor substrate are first implanted into the semiconductor substrate to form wells. Then, unit devices are formed on the semiconductor substrate.

Different kinds of wells are formed by using different methods. For diffused wells, e.g., a single well, twin wells, triple wells, ions are entirely or partially implanted into the semiconductor substrate and then diffused prior to performing a device-isolating process. For retrograde wells, ions are implanted by adjusting the ion-implantation energy to form wells of different types after performing a device-isolating process. Also, some retrograde wells have a buried implanted layer for lateral isolation (BILLI) structure.

A diffusion process can be performed to a desired depth from surface of the substrate to form a single well and twin wells. In this case, diffusion proceeds both vertically and horizontally. As a result, it is difficult to form a desired profile and the process tolerance becomes smaller. For this reason, triple wells are preferred to twin and single wells. However, the process of forming triple wells is very complicated and thus leads to low productivity. Therefore, research and development efforts are currently directed to simplifying the fabrication process for triple wells.

A conventional method for forming wells of a semiconductor device will be discussed with reference to FIGS. 1A to 1G. As shown in FIG. 1A, a first oxide layer 2 and a first nitride layer 3 are successively formed on a semiconductor substrate by a chemical vapor deposition (CVD) process.

Referring to FIG. 1B, a photoresist film 4 is coated on the first nitride layer 3 and then patterned by an exposure and development process. With the photoresist pattern 4 serving as a mask, the first nitride layer 3 is partially removed. Next, phosphorus ions are implanted into the semiconductor substrate 1 with a high energy of 500 KeV to form an n-shield region 5 in a predetermined depth. In this case, the photoresist film 4 has a thickness of 4 $\mu$m to prevent the high energy phosphorus ions from implanting to the semiconductor substrate 1 under the photoresist pattern 4.

Referring to FIG. 1C, the remaining photoresist film 4 is removed. Then, a thermal oxidation process is performed over the semiconductor substrate 1 to form a second oxide layer 6, which functions as an align key to discern a cell region from a periphery region.

Referring to FIG. 1D, the first nitride layer 3, the first oxide layer 2, and the second oxide layer 6 are all removed. A third oxide layer 7 and a second nitride layer 8 are deposited on the semiconductor substrate 1 with a CVD process. As shown in FIG. 1D, a step coverage is generated on the portion of the semiconductor substrate 1 where the second oxide layer 6 is removed.

Referring to FIG. 1E, another photoresist film 9 is coated on the semiconductor substrate 1 and then selectively patterned by an exposure and development process to be removed over a periphery portion of the n-shield region 5 and over a portion separated by a predetermined distance from the periphery portion of the n-shield region 5. With the photoresist pattern 9 serving as a mask, the second nitride layer 8 and the third oxide layer 7 are partially removed. Thereafter, phosphorus ions are implanted into the exposed semiconductor substrate 1 with a low implantation energy to form first and second n-wells 10a and 10b. The first and second n-wells 10a and 10b are formed at a shallower depth than the n-shield region 5. Here, the first n-well 10a is placed above the n-shield region 5 and the second n-well 10b is formed a distance away from the n-shield region 5.

Referring to FIG. 1F, with the photoresist pattern 9 serving as a mask, a fourth oxide layer 11 is formed on the exposed semiconductor substrate 1. After the second nitride layer 8 and the remaining photoresist film 9 are removed, either p-type B ions or $BF_2$ ions are implanted to form first and second p-wells 12a and 12b by an self-alignment process. At this time, the first and second p-wells 12a and 12b are formed at the same depth as the first and second n-wells 10a and 10b. The first p-well 12a is placed above the n-shield region 5 and next to the first n-well 10a. The second p-well 12b is placed between the first and second n-wells 10a and 10b.

Referring to FIG. 1G, the fourth oxide layer 11 is removed. The first and second n-wells 10a and 10b and the first and second p-wells 12a and 12b are diffused by a driven-in process. At this time, the first p-well 12a is diffused down to the boundary of the n-shield region 5 and the first n-well 10a is diffused to the n-shield region 5. And the second n-well 10b is diffused to the same depth as the first n-well 10a. The second p-well 12b is diffused between the first n-well 10a and the second n-well 10b. Therefore, the first p-well 12a in the cell region is isolated from the second p-well 12b in the periphery region.

The conventional method for forming wells of a semiconductor device has the following problems. First, since several diffusion processes and CVD processes are required, the overall process is complicated and thus leads to inferior productivity. Further, when a cell region and a periphery region are isolated from each other through CVD processes, a step coverage is created between a first n-well in the cell region and a second p-well in the periphery region.

SUMMARY OF THE INVENTION

Accordingly, the present invention is directed to a method for forming wells of a semiconductor device that substantially obviates one or more of the problems due to limitations and disadvantages of the related art.

An object of the present invention is to provide a method for forming wells of a semiconductor device with a simplified overall process and a reduced step coverage between a cell region and a periphery region.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming wells of a semiconductor device includes the steps of forming a plurality of field insulating layers on a semiconductor substrate in a field region, forming first impurity regions of a first conductive type in a predetermined depth beneath surface of the semiconductor substrate, forming first impurity regions of a second conductive type beneath the entire surface of the semiconductor substrate between the field insulating layers, forming second impurity regions of a second conductive type in the first impurity regions of a first conductive type between the adjacent field insulating layers, forming second impurity regions of a first conductive type in the first impurity regions of a second conductive type at both sides of the second impurity regions of a second conductive type, and diffusing the first and second impurity regions of a first conductive type and the first and second impurity regions of a second conductive type by a drive-in process so as to form a first conductive type shield region, a first conductive type well, and first and second wells of a second conductive type.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
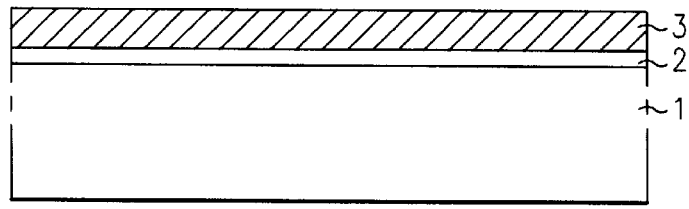
FIGS. 1A to 1G are cross-sectional views showing process steps of a conventional method for forming wells of a semiconductor device.
Figure 1B:
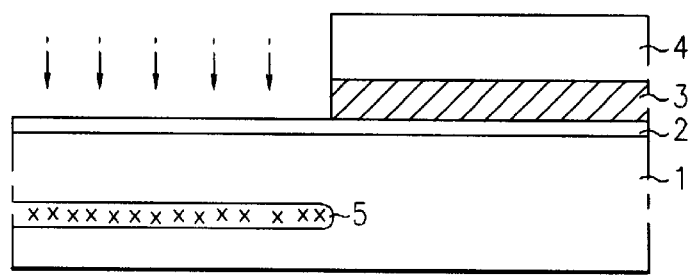
Figure 1C:
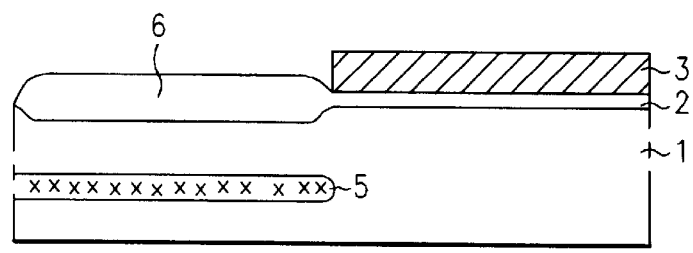
Figure 1D:
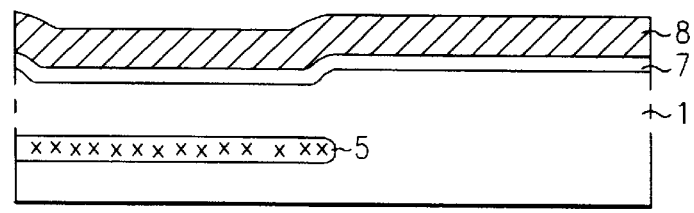
Figure 1E:
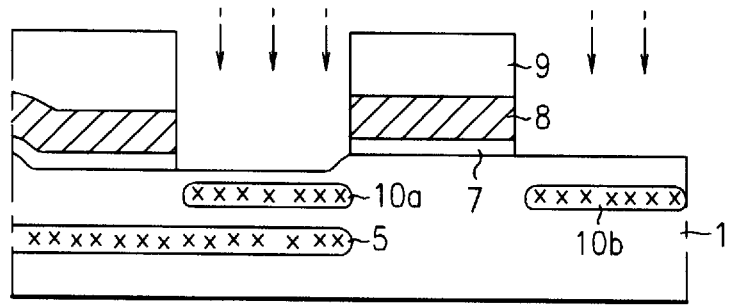
Figure 1F:
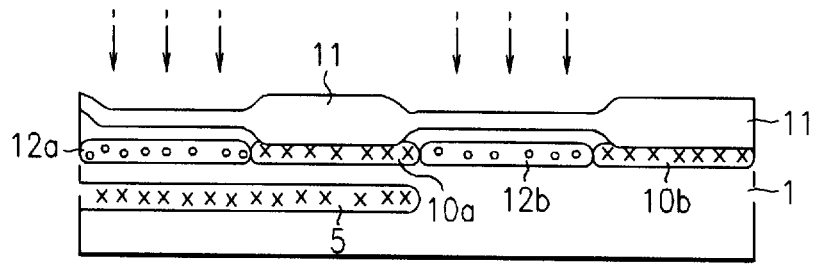
Figure 1G:
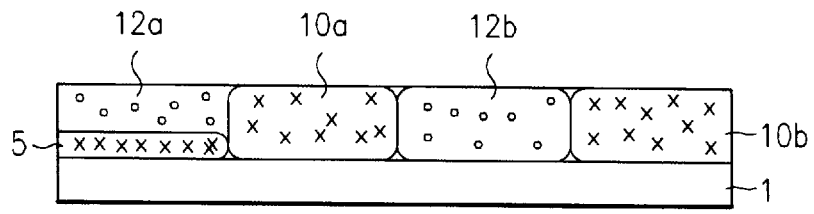
Figure 2A:
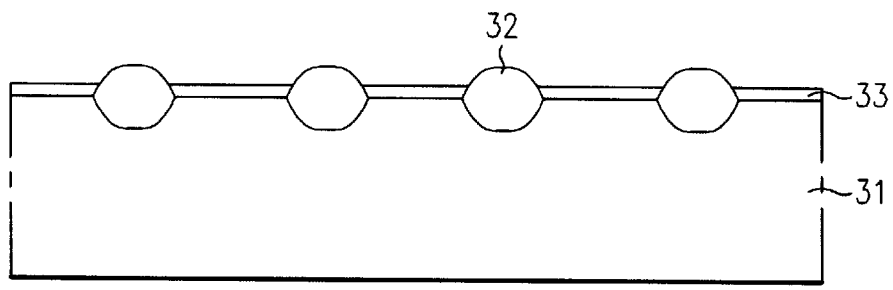
FIGS. 2A to 2F are cross-sectional views showing process steps of a method for forming wells of a semiconductor device according to a preferred embodiment of the present invention.

Referring initially to FIG. 2A, a field region and an active region are defined in a semiconductor substrate 31 and then a plurality of field oxide layers 32 are formed on the field region. A buffer oxide layer 33 is deposited on the semiconductor substrate 31.

Figure 2B:
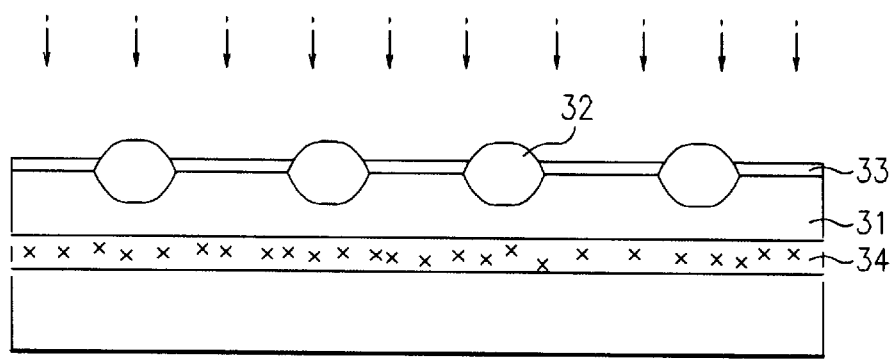

Referring to FIG. 2B, impurity ions are implanted into the semiconductor substrate 31 with a high energy of around 500 KeV without using any mask to form an n-shield region 34 at a predetermined depth in the semiconductor substrate 31.

Figure 2C:
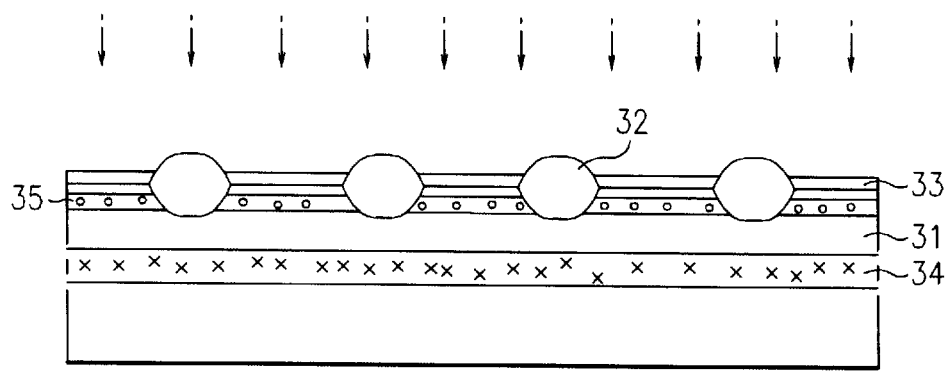

Referring to FIG. 2C, B ions or $BF_2$ ions are implanted into the semiconductor substrate 31 by a low energy without using any mask to form a first p-well 35. The ions are implanted down to the depth of the bottom of the field oxide layer 32.

Figure 2D:
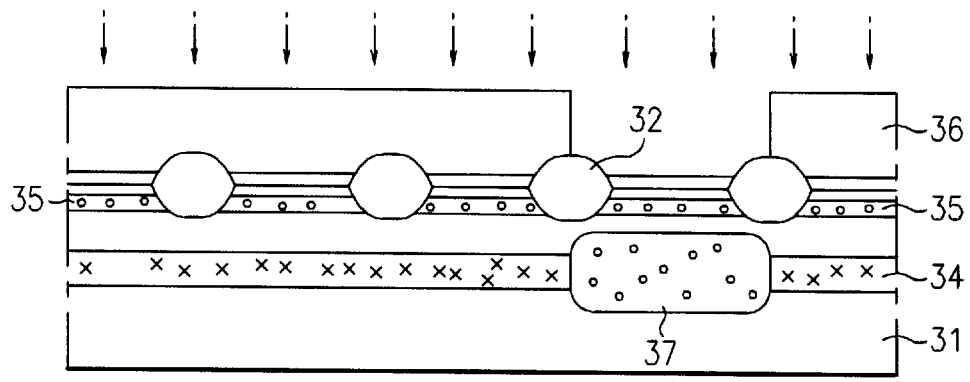

Referring to FIG. 2D, a photoresist film 36 is coated on the semiconductor substrate 31 and patterned by an exposure and development process. With the photoresist pattern 36 as a mask, B ions or $BF_2$ ions are implanted to the n-shield region 34 to form a second p-well 37. Here, the ions used to form the second p-well 37 are heavily doped ions and have a higher concentration than that of the ions used to form the n-shield region 34. In addition, the ions are implanted with a high energy. Next, the remaining photoresist film 36 is removed.

Figure 2E:
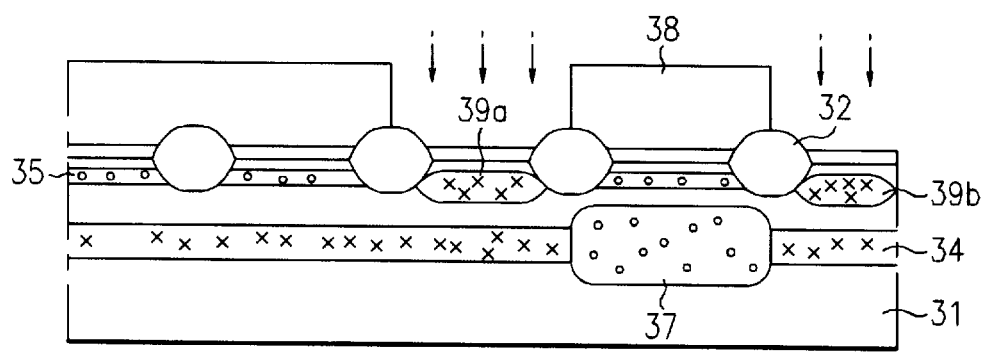

Referring to FIG. 2E, another photoresist film 38 is coated on the semiconductor substrate 31 and then patterned by an exposure and development process to be removed over the semiconductor substrate at both sides of the second p-well 37. With the photoresist pattern 38 serving as a mask, n-type impurity ions having a higher concentration than that of the ions used to form the first p-well 35 are implanted with a low energy to the first p-well 35 to form first and second n-wells 39a and 39b.

Figure 2F:
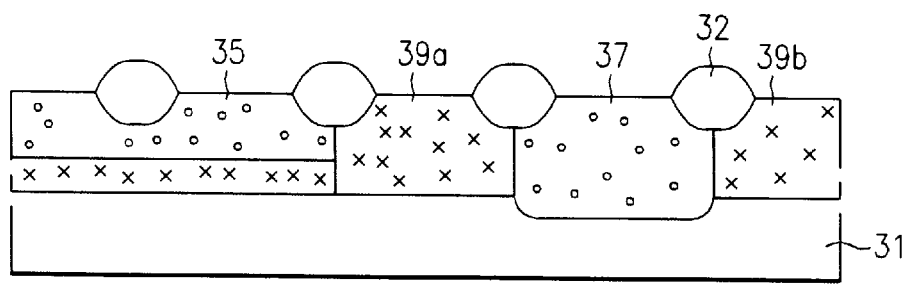

Referring to FIG. 2F, the first and second n-wells 39a and 39b and the first and second p-wells 35 and 37 are diffused by a drive-in process. By such a diffusion process, the n-shield region 34 is formed at a predetermined depth below the surface of the semiconductor substrate, the first p-well 35 is formed between the first n-shield region 34 and the surface of the semiconductor substrate 31, the second p-well 37 is formed at one side of the n-shield region 34a, and the second n-well 39b is formed at one side of the second p-well 37. Accordingly, the triple wells are formed to isolate the first p-well 35 in the cell region from the second p-well 37 in the periphery region.

The method for forming wells of a semiconductor device according to the present invention has the following advantages. Since no CVD process and diffusion processes are used for the well formation, the processing time is shortened and thus the productivity is enhanced. Further, this process does not cause any step coverages.

It will be apparent to those skilled in the art that various modifications and variations can be made in the method for forming wells of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming wells of a semiconductor device, comprising the steps of:

forming a plurality of field insulating layers on a field region of a semiconductor substrate;

forming first impurity regions of a first conductive type at a first depth beneath a surface of the semiconductor substrate;

forming first impurity regions of a second conductive type beneath the surface of the semiconductor substrate at a second depth between the field insulating layers;

selectively forming second impurity regions of the second conductive type in the first impurity regions of the first conductive type between adjacent field insulating layers;

forming second impurity regions of the first conductive type in the first impurity regions of the second conductive type at both sides of the second impurity regions of the second conductive type; and diffusing the first and second impurity regions of the first conductive type and the first and second impurity regions of the second conductive type by a drive-in process to form a first conductive type shield region, a first conductive type well, and first and second wells of a second conductive type.

2. The method as claimed in claim 1, wherein the step of forming first impurity regions of the first conductive type includes implanting phosphorus ions having a first concentration with a first high energy without using a mask.

3. The method as claimed in claim 2, wherein the first high energy is approximately 500 KeV.

4. The method as claimed in claim 2, wherein the step of forming second impurity regions of the second conductive type includes implanting ions having a second concentration with a second high energy, the second concentration being higher than the first concentration.

5. The method as claimed in claim 4, wherein the ions implanted in forming the second impurity regions of the second conductive type include one of B ions and $BF_2$ ions.

6. The method as claimed in claim 4, wherein a photoresist pattern is used as a mask when implanting the ions.

7. The method as claimed in claim 1, wherein the step of forming first impurity regions of the second conductive type includes implanting B ions or $BF_2$ ions having a third concentration with a low energy without using a mask.

8. The method as claimed in claim 7, wherein the step of forming second impurity regions of the first conductive type includes implanting phosphorus ions having a fourth concentration with a low energy, the fourth concentration being higher than the third concentration.

9. The method as claimed in claim 8, wherein a photoresist pattern is used as a mask when implanting the phosphorous ions having the fourth concentration.

10. The method as claimed in claim 1, wherein the first depth is deeper than the second depth.

11. The method as claimed in claim 1, further comprising the step of forming a buffer oxide layer on the semiconductor substrate before the step of forming first impurity regions of a first conductive type.

12. The method as claimed in claim 1, wherein the second depth is level with bottoms of the plurality of field insulating layers.

* * * * *